United States Patent
Zelikson et al.

(10) Patent No.: US 7,880,284 B2
(45) Date of Patent: Feb. 1, 2011

(54) EMBEDDED POWER GATING

(75) Inventors: Michael Zelikson, Haifa (IL); Alex Waizman, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 16 days.

(21) Appl. No.: 11/864,918

(22) Filed: Sep. 29, 2007

(65) Prior Publication Data
US 2009/0085607 A1   Apr. 2, 2009

(51) Int. Cl.
*H01L 23/02* (2006.01)
*H01L 23/06* (2006.01)
*H01L 23/52* (2006.01)
*H01L 23/04* (2006.01)
*H01L 23/053* (2006.01)
*H01L 23/12* (2006.01)
*H01L 27/10* (2006.01)
*H01L 29/73* (2006.01)

(52) U.S. Cl. .............. 257/678; 257/203; 257/207; 257/684; 257/691; 257/698; 257/700; 257/E23.001; 257/E23.151; 257/E23.152; 257/E23.153

(58) Field of Classification Search .......... 257/203, 257/207, 678, 684, 691, 698, 700, E23.001, 257/E23.151, E23.152, E23.153
See application file for complete search history.

(56) References Cited

U.S. PATENT DOCUMENTS

| | | | | |
|---|---|---|---|---|
| 4,908,525 A | * | 3/1990 | Yung | 326/103 |
| 5,610,085 A | * | 3/1997 | Yuan et al. | 438/187 |
| 5,715,144 A | * | 2/1998 | Ameen et al. | 361/790 |
| 5,872,403 A | * | 2/1999 | Bowman et al. | 257/780 |
| 5,874,778 A | * | 2/1999 | Bhattacharyya et al. | 257/758 |
| 5,880,517 A | * | 3/1999 | Petrosky | 257/577 |
| 6,097,046 A | * | 8/2000 | Plumton | 257/266 |
| 6,392,301 B1 | | 5/2002 | Waizman | |
| 6,426,680 B1 | * | 7/2002 | Duncan et al. | 331/34 |
| 6,542,001 B1 | * | 4/2003 | Yu | 326/68 |
| 6,635,970 B2 | * | 10/2003 | Lasky et al. | 257/777 |
| 6,806,569 B2 | * | 10/2004 | Breisch et al. | 257/728 |
| 6,836,021 B2 | * | 12/2004 | Ishikawa et al. | 257/777 |
| 6,946,824 B2 | | 9/2005 | Waizman | |
| 7,501,699 B2 | | 3/2009 | Gauche | |
| 7,518,355 B2 | * | 4/2009 | Grassi et al. | 324/158.1 |
| 7,598,630 B2 | * | 10/2009 | Burton | 307/140 |
| 7,619,901 B2 | * | 11/2009 | Eichelberger et al. | 361/763 |
| 2005/0199953 A1 | * | 9/2005 | Kawamura et al. | 257/341 |
| 2005/0207133 A1 | * | 9/2005 | Pavier et al. | 361/761 |
| 2005/0213267 A1 | * | 9/2005 | Azrai et al. | 361/15 |
| 2006/0071650 A1 | * | 4/2006 | Narendra et al. | 323/285 |
| 2006/0131070 A1 | | 6/2006 | Wong | |
| 2006/0226477 A1 | * | 10/2006 | Brar et al. | 257/341 |

(Continued)

OTHER PUBLICATIONS

U.S. Appl. No. 09/945,748, filed Sep. 6, 2001 entitled Power Delivery System and Method for Setting Power Delivery System Parameters, inventors Alexander Waizman and Chee Yee Chung.

(Continued)

*Primary Examiner*—Ida M Soward
(74) *Attorney, Agent, or Firm*—Erik R. Nordstrom

(57) ABSTRACT

With embodiments disclosed herein, the distribution of gated power is done using on-die layers without having to come back out and use package layers.

12 Claims, 4 Drawing Sheets

U.S. PATENT DOCUMENTS

2009/0085217 A1* 4/2009 Knickerbocker et al. .... 257/774
2009/0085552 A1 4/2009 Franza

OTHER PUBLICATIONS

Chung, Chee Yee et al., "Mounting Capacitors Under Ball Grid Array", U.S. Appl. No. 10/334,750 filed on Dec. 31, 2002.

Royannez, Philippe et al., "90NM Low Leakage Soc Design Techniques for Wireless Applications", ISSCC 2005 / Session 7 / Multimedia Processing / 7.6, Feb. 2005, 3 pages.

Waizman, Alex et al., "Power Delivery System and Method for Setting Power Delivery System Parameters", U.S. Appl. No. 09/945,748 filed Sep. 6, 2001.

* cited by examiner

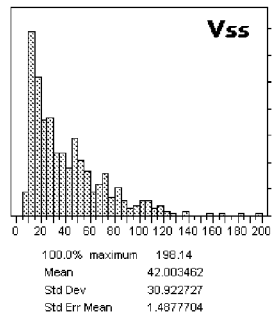 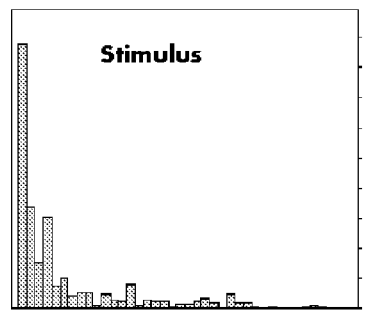 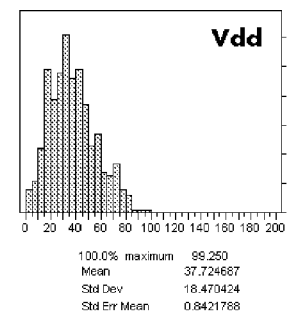
FIGURE 4A      FIGURE 4B      FIGURE 4C
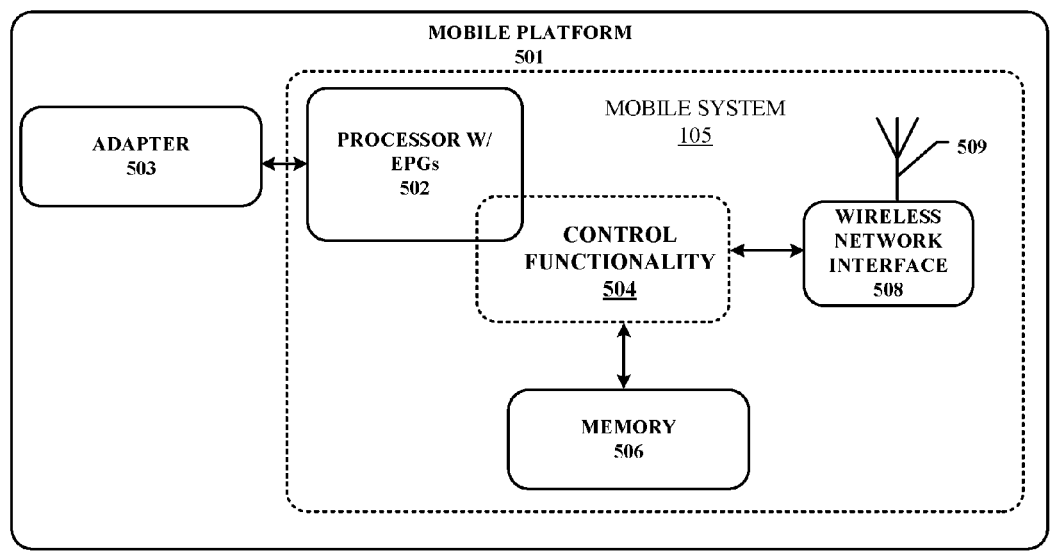
FIGURE 5

EMBEDDED POWER GATING

TECHNICAL FIELD

This invention relates generally to power delivery in an integrated circuit device and in particular, to delivering power using embedded power gates.

BRIEF DESCRIPTION OF THE DRAWINGS

Embodiments of the invention are illustrated by way of example, and not by way of limitation, in the figures of the accompanying drawings in which like reference numerals refer to similar elements.

FIGS. 4A to 4C show current distribution in an area of a die with on-die embedded power gating power delivery in accordance with some embodiments.

FIG. 5 is a block diagram showing a portion of a mobile platform system with a processor having embedded power gates in accordance with some embodiments.

DETAILED DESCRIPTION

The use of embedded power gates, as taught herein, can allow for significant reduction of leakage power in processor chips. Power gating involves intercepting the voltage supply network from functional circuitry. Power gates may be used either on positive, or negative supply branches. (For simplicity sake, this description primarily focuses on the use of positive power supply gating, but inventive embodiments may also incorporate negative supply gating as well.)

With power gating schemes of the past, for various reasons, among other things including uncertainties in estimation of local power dissipation, it has been difficult to ensure that predictable voltage drops will occur on the local power gates with EPG embodiments disclosed herein, this problem is overcome due to an inherent, current self re-distribution. Unlike some of the power schemes of the past, the current invention describes a way of providing high (e.g., tens of Amps) current through embedded Power Gates. In some embodiments, embedded power gate transistors (EPGs) are clustered into stripes and spread reasonably evenly over circuitry to be gated. Unlike with prior power gating schemes, the distribution of the gated power is done using on-die metal layers (e.g., M1 through M9 layers) without having to come back out and use package layers, as has typically been done. This allows for lower IR drops, and more evenly distributed current dissipation, thereby allowing for less robust die layers (as opposed to package layers) to be employed.

Figure 1:
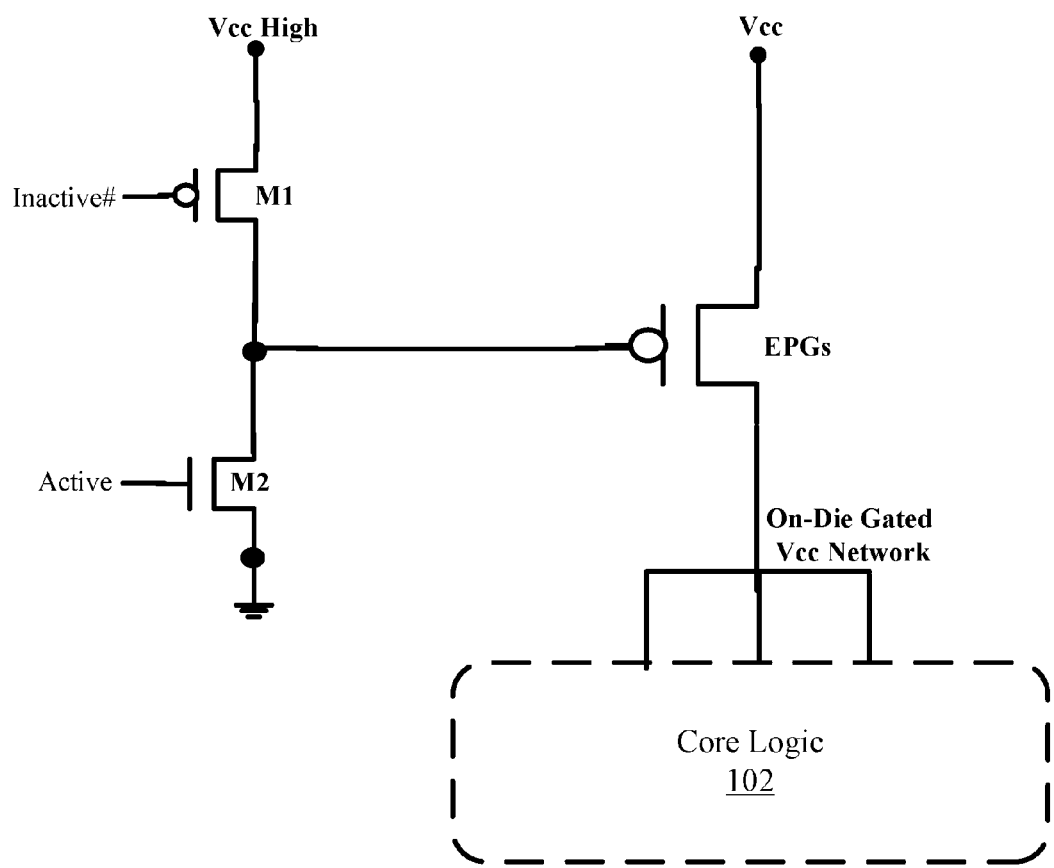
FIG. 1 is a general circuit diagram showing two power delivery modes in an integrated circuit device in accordance with some embodiments.

With reference to FIG. 1, a general diagram showing a power gating scheme for supplying power to core logic 102 in a processor is shown. A P-type gate labeled "EPG" is coupled in series between an ungated power supply (Vcc) and the core logic 102. Note that the P-type gate labeled EPG is represented with a single P-type transistor. However, this actually represents numerous, e.g., hundreds of thousands or millions, of EPG transistors distributed over a region to be served. This number will typically depend on a tradeoff between desired granularity and process complexity. In addition, while core logic 102 is shown, any functional group(s) of circuitry in any suitable integrated circuit may be gated as taught herein.

Control transistors M1, M2 are coupled as shown and controlled with an Inactive# signal (M1) and an Active signal (M2). When Inactive# is asserted (Low), Active will be de-asserted (Low), which causes an increased supply (Vcc High) to be applied to the EPGs to turn them off fairly strongly, which decouples (or strongly reduces) the Vcc supply from the core logic 102. On the other hand, when the circuit is in Active mode, the Active signal is asserted (High) and Inactive# is de-asserted (High) to turn on the EPGs and couple the Vcc supply to the core logic 102. In some embodiments, the active and inactive modes correspond to two main "C" states: C0 and C6 from the Advanced Configuration and Power Interface (ACPI) specification. The C0 state corresponds to the active state when a processor core is operational, and C6 (inactive mode) corresponds to a non-operational core.

Figure 2:
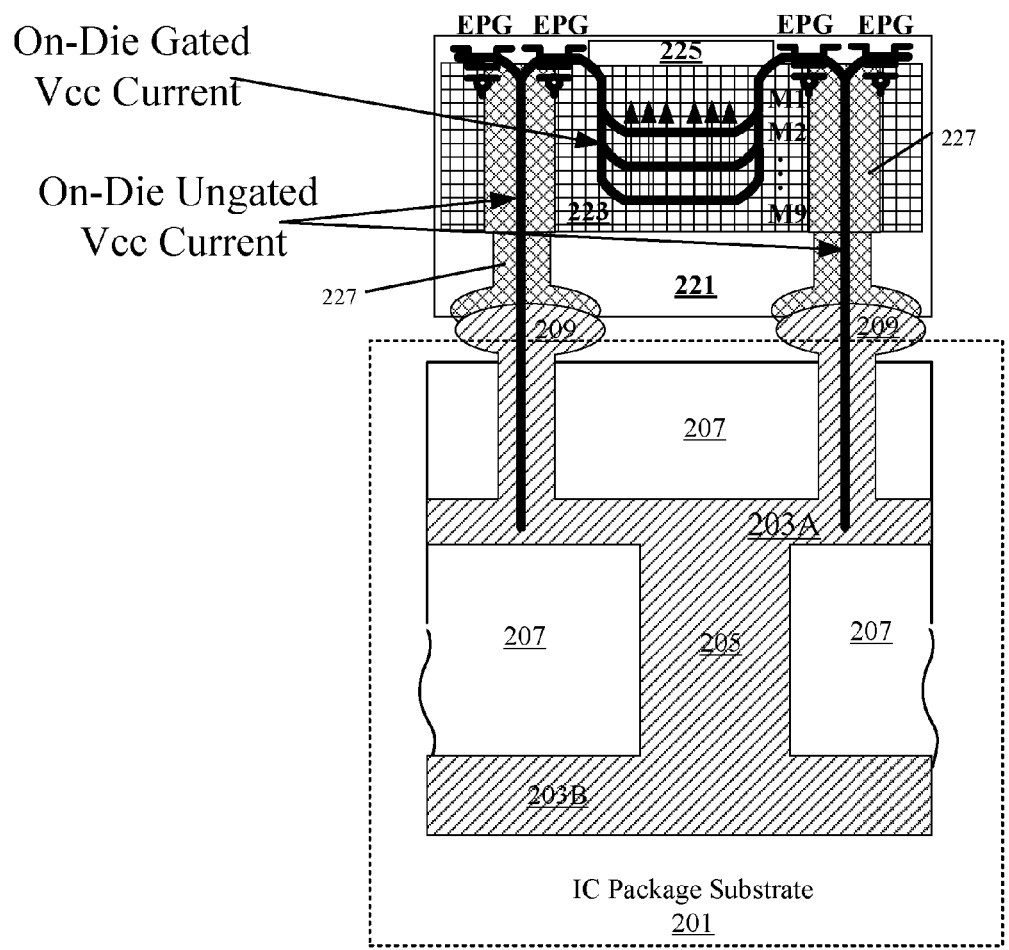
FIG. 2 is a diagram showing a side view of power delivery network for an integrated circuit device in accordance with some embodiments.

FIG. 2 shows a side view of a portion of an integrated circuit (IC) comprising a die 221 operably mounted to an IC package substrate 201. The depicted substrate portion comprises conductive layers 203A, 203B (electrically coupled together with via 205) and surrounded by electrically insulating and structurally supporting material 207. (Shown here is just a portion of a package substrate and die. For example, there will normally be more conductive layers, as well as other features, in a package substrate.) The conductive layers 203 are part of an ungated Vcc power delivery network to provide the Vcc supply to the die 221. The ungated power is electrically coupled to the die 221 through solder bumps 209 (C4 solder bumps in this figure).

The depicted portion of the die 221 comprises conductive metal layers 223 (M1 to M9 in this depiction), core logic circuitry 225, embedded power gates (labeled as EPG), and power delivery vias 227. The power delivery vias 227 provide ungated Vcc supply power to the EPGs, which in turn, controllably distributes the now "gated" Vcc power to selected portions of the core logic circuitry 225 by way of metal layers 223.

Figure 3:
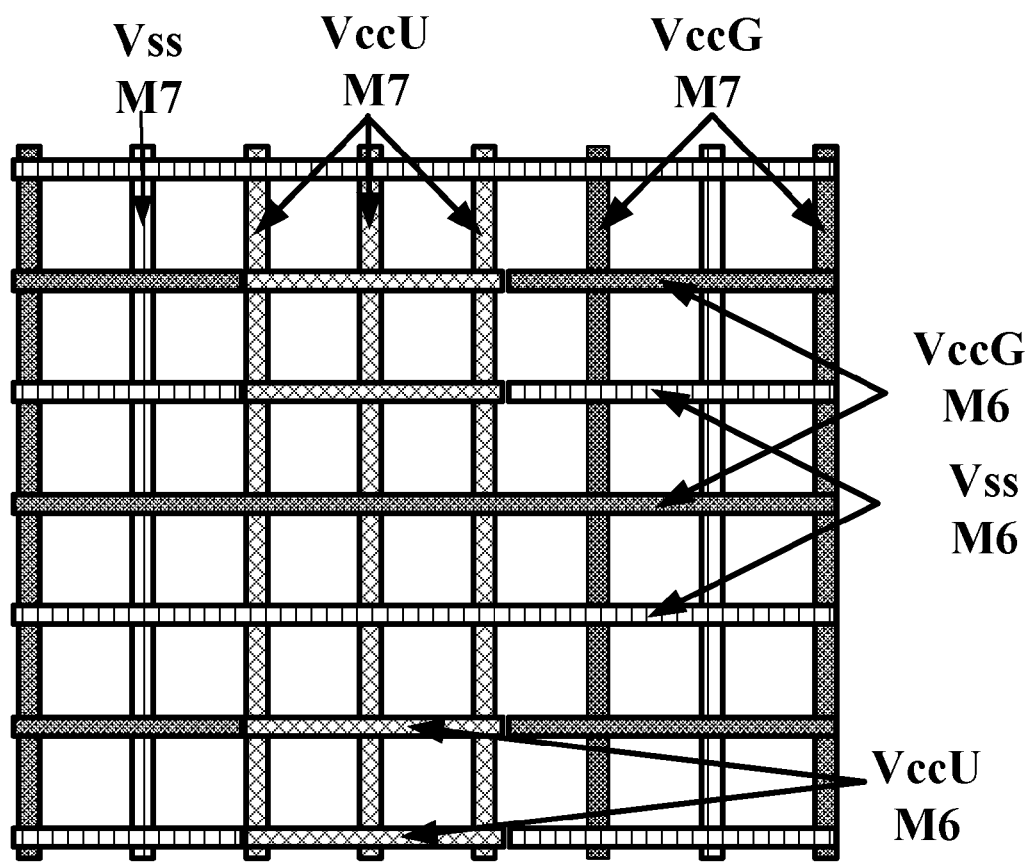
FIG. 3 is a diagram showing gated and ungated power distribution using on-die metal layers in accordance with some embodiments.

FIG. 3 shows how the gated (VccG), ungated (VccU), and Vss power grids may be implemented to evenly distribute gated and ungated supplies to the die circuitry using supply stripes formed out of the various die layers. (In this depiction, for simplicity sake, only the M6 and M7 layers are shown.) The use of higher numbers of EPG transistors, clustered into relatively uniform EPG stripes (or strips) supports power management with finer granularity. This results in the ability to independently enable/disable a higher number of separate functional circuit groups (or domains).

In some embodiments, ungated power (VccU) is provided to the die using the more distal die layers (e.g., M9 and M8), while the more proximal die layers (e.g., M1 to M7) may be used primarily for the gated supply grid. The gated grid (VccG) may be divided into several different power domains (VccG[i]), in accordance with desired design considerations. There may be no direct cross-domain connectivity among positive gated supplies, but nodes from a certain domain may be connected into a single network, forming a low resistance path. Gated power (VccG) for each domain may be connected to the ungated power supply (VccU) by means of some of the EPGs, designated for this purpose, that fall within the associated domain boundaries (EPG[i]). The gated supply may than be distributed to the core logic circuitry 225 by means of the gated power grid (VccG) within die layers 223.

The particular current paths from a power gate to a "client" circuit element are determined by path of least resistance, taking the least possible IR drop. Thus, circuitry that is close to a given power gate will be fed by more proximal layers (e.g., M2 and M4), while more distant circuitry will primarily use the more distal layers (e.g., M5, M6, M7, M8, and/or M9). Since the resistance of a section of the gated power grid (e.g., metal die layer sections) will be lower than that of corresponding sections of EPGs, each local current source will use the widest possible power gate resources. In other words, a voltage drop across the power gate primarily depends on the total power consumption of the gate's domain, averaged over its area and thus, suitable EPG transistor tolerances can be defined.

The effectiveness of this on-die current averaging is illustrated in FIG. 4, which shows a simulated distribution of Vss bump current (FIG. 4a) and VccU bump current (FIG. 4c) along a line in the die. For this computer generated simulation, the VccU and Vss bumps are effectively connected to a DC source and the energy, required for the on-die current sources, is provided through the bumps. FIG. 4b presents the distribution of the on-die current sources along the same line. As evident from FIGS. 4a and 4b, there is a fair correlation between the spatial distribution of the on-die current sources and the Vss bump currents. This indicates that Vss current is provided to the bumps through the local power grid resources. On the other hand, the distribution of VccU bump current exhibits much lower standard deviation and much lower maximums, which means that even local, on-die current consumption results in relatively long range on-die resource sharing.

With reference to FIG. 5, one example of a portion of a mobile platform 501 (e.g., computing system such as a mobile personal computer, PDA, cell phone, or the like) is shown. The represented portion comprises one or more processors 502, power supply 503, interface control functionality 504, memory 506, wireless network interface 508, and an antenna 509. The power supply 503, which may include one or more AC adaptors, batteries, and/or DC-DC voltage regulators, provides DC supplies to the platform components. The processor(s) 502 is coupled to the memory 506 and wireless network interface 508 through the control functionality 504. The processor(s) 502 has EPGs to provide it with gated power as has been discussed herein. The control functionality may comprise one or more circuit blocks to perform various interface control functions (e.g., memory control, graphics control, I/O interface control, and the like. These circuits may be implemented on one or more separate chips and/or may be partially or wholly implemented within the processor(s) 502.

The memory 506 comprises one or more memory blocks to provide additional random access memory to the processor(s) 502. It may be implemented with any suitable memory including but not limited to dynamic random access memory, static random access memory, flash memory, or the like. The wireless network interface 508 is coupled to the antenna 509 to wirelessly couple the processor(s) 502 to a wireless network (not shown) such as a wireless local area network or a cellular network.

The mobile platform 501 may implement a variety of different computing devices or other appliances with computing capability. Such devices include but are not limited to laptop computers, notebook computers, personal digital assistant devices (PDAs), cellular phones, audio and/or or video media players, and the like. It could constitute one or more complete computing systems or alternatively, it could constitute one or more components useful within a computing system.

In the preceding description, numerous specific details have been set forth. However, it is understood that embodiments of the invention may be practiced without these specific details. In other instances, well-known circuits, structures and techniques may have not been shown in detail in order not to obscure an understanding of the description. With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The term "PMOS transistor" refers to a P-type metal oxide semiconductor field effect transistor. Likewise, "NMOS transistor" refers to an N-type metal oxide semiconductor field effect transistor. It should be appreciated that whenever the terms: "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs, material types, insulator thicknesses, gate(s) configurations, to mention just a few. Moreover, unless specifically referred to as MOS or the like, the term transistor can include other suitable transistor types, e.g., junction-field-effect transistors, bipolar-junction transistors, metal semiconductor FETs, and various types of three dimensional transistors, MOS or otherwise, known today or not yet developed.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. An IC device, comprising:
a package substrate having an ungated supply grid; and
an IC die having: (i) circuitry to receive one or more gated supplies, and (ii) a plurality of embedded power gate (EPG) transistors coupled between the ungated power grid and said circuitry to controllably provide the one or more gated supplies to the circuitry, the IC die having a plurality of die layers, the one or more gated supplies being distributed to said circuitry through the plurality of die layers, wherein the circuitry is divided into separate gated supply domains each having an associated gated supply from the one or more gated supplies, and wherein the circuitry corresponds to a core of a processor.

2. The device of claim 1, in which no gated supply is conveyed through the package substrate.

3. The device of claim 1, in which the die layers comprise at least six layers to implement a gated supply grid to provide the one or more gated supplies.

4. The device of claim 1, in which the ungated grid is coupled to the EPG transistors by way of C4 solder bumps.

5. The device of claim 1, in which the EPG transistors are disposed in evenly spaced strips.

6. The device of claim 1, in which the die layers comprise layers proximal and distal to the circuitry.

7. The device of claim 6, in which an EPG transistor is coupled to circuitry elements that are close to it through proximal die layers and to circuitry elements that are farther away through the distal layers.

8. A system, comprising:
(a) a microprocessor including: a package substrate having an ungated supply grid, and
an IC die having:
(i) core logic circuitry to receive one or more gated supplies, and
(ii) a plurality of embedded power gate (EPG) transistors coupled between the ungated power grid and said core logic circuitry to controllably provide the one or more gated supplies to the core logic circuitry, the IC die having a plurality of die layers, the one or more gated supplies being distributed to said core logic circuitry through the plurality of die layers
(b) an antenna; and
(c) a wireless interface coupled to the microprocessor and to the antenna to communicatively link the microprocessor to a wireless network.

9. The system of claim 8, in which the circuitry is divided into separate gated supply domains each having an associated gated supply from the one or more gated supplies.

10. The system of claim 8, in which no gated supply is conveyed through the package substrate.

11. The system of claim 8, in which the die layers comprise at least six layers to implement a gated supply grid to provide the one or more gated supplies.

12. The system of claim 8, in which the circuitry corresponds to a core of a processor.

* * * * *